(12) United States Patent
Sugino et al.

(10) Patent No.: US 7,759,794 B2
(45) Date of Patent: Jul. 20, 2010

(54) SEMICONDUCTOR DEVICE

(75) Inventors: Mitsuo Sugino, Tokyo (JP); Takeshi Hosomi, Tokyo (JP); Yushi Sakamoto, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 616 days.

(21) Appl. No.: 11/793,816

(22) PCT Filed: Mar. 9, 2006

(86) PCT No.: PCT/JP2006/304610

§ 371 (c)(1),
(2), (4) Date: Jun. 22, 2007

(87) PCT Pub. No.: WO2006/098219

PCT Pub. Date: Sep. 21, 2006

(65) Prior Publication Data

US 2008/0042272 A1      Feb. 21, 2008

(30) Foreign Application Priority Data

Mar. 14, 2005   (JP) ............................. 2005-072063

(51) Int. Cl.
*H01L 23/48* (2006.01)
*H01L 23/29* (2006.01)
(52) U.S. Cl. .................. 257/737; 257/789; 257/795
(58) Field of Classification Search ................ 257/737, 257/738, 777, 778, 789, 795, E21.503, E23.005, 257/E23.021
See application file for complete search history.

(56) References Cited

U.S. PATENT DOCUMENTS

| 6,469,373 | B2 * | 10/2002 | Funakura et al. ............ 257/679 |
| 7,256,503 | B2 * | 8/2007 | Daubenspeck et al. ...... 257/778 |
| 7,582,510 | B2 * | 9/2009 | Todd et al. .................. 438/106 |
| 2002/0140095 | A1 | 10/2002 | Funakura et al. |
| 2004/0222522 | A1 | 11/2004 | Homma |

FOREIGN PATENT DOCUMENTS

| JP | 11-233571 | 8/1999 |
| JP | 2002-16211 | 1/2002 |
| JP | 2002-299523 | 10/2002 |
| JP | 2004-207566 | 7/2004 |
| JP | 2004-277671 | 10/2004 |
| JP | 2004-281491 | 10/2004 |
| JP | 2005-011838 | 1/2005 |

OTHER PUBLICATIONS

Office Action corresponding to JP Patent Application No. 2007-508095.

* cited by examiner

*Primary Examiner*—Hung Vu
(74) *Attorney, Agent, or Firm*—Smith, Gambrell & Russell, LLP (57) ABSTRACT

A semiconductor device 100 has a BGA substrate 110, a semiconductor chip 101, a bump 106 and an underfill 108 filling the periphery of the bump. An interlayer dielectric 104 in the semiconductor chip 101 contains a low dielectric constant film. The bump 106 is comprised of a lead-free solder. The underfill 108 is comprised of a resin material having an elastic modulus of 150 MPa to 800 MPa both inclusive, and a linear expansion coefficient of the BGA substrate 110 in an in-plane direction of the substrate is less than 14 ppm/° C.

11 Claims, 7 Drawing Sheets

| | Example 1-1 | Example 1-2 | Comparative Example 1-1 | Comparative Example 1-2 |
|---|---|---|---|---|
| Bisphenol-F type epoxy resin (equivalent: 165) | 13.5 | 18 | 30 | 20 |
| N-[2-Methyl-4-(oxiranylmethoxy)phenyl]-N-(oxiranylmethyl)oxiranemethanamine 1) | 13.5 | 6 | 0 | 20 |
| 4,4'-Methylenebis-(2-ethylaniline) 2) | 13 | 10 | 10 | 19 |
| γ-Glycidylpropyltriethoxysilane 3) | 1 | 1 | 1 | 1 |
| Spherical fused silica (average particle size: 0.5 μm) 4) | 65 | 65 | 65 | 40 |
| Glass transition temperature (°C) | 100 | 90 | 80 | 100 |
| Bend elastic constant (MPa: 125 °C) | 510 | 160 | 30 | 350 |
| Thermal expansion coefficient (ppm/°C) | 25 | 26 | 26 | 45 |

Fig. 5

| | Example 2-1 | Example 2-2 | Example 2-3 | Example 2-4 | Example 2-5 | Comp. Example 2-1 | Comp. Example 2-2 | Comp. Example 2-3 |
|---|---|---|---|---|---|---|---|---|
| Spherical fused silica (average particle size: 0.5 μm) 1) | 60 | 60 | 40 | 50 | 45 | 60 | 25 | |
| Spherical fused silica (average particle size: 0.3 μm) 2) | 10 | | 5 | | | | | |
| Epoxy silane coupling agent 3) | 0.3 | 0.3 | 0.3 | 0.3 | 0.3 | 0.3 | 0.3 | |
| Novolac type cyanate resin (weight average molecular weight: 2600) 4) | 20 | 20 | 30 | 30 | 40 | | 40 | 50 |
| Novolac type cyanate resin (weight average molecular weight: 700) 5) | | | 10 | | | | | |
| Biphenylalkylene type epoxy resin 6) | 6 | 11 | 8 | 11 | 8 | 22.5 | 20 | 28 |
| Biphenylalkylene type phenol novolac resin 7) | 4 | 9 | 5 | 9 | 7 | 17.5 | 15 | 22 |
| Phenol novolac resin 8) | | | 2 | | | | | |
| Glass transition temperature (°C) | 240 | 220 | 240 | 230 | 250 | 150 | 200 | 200 |
| Thermal expansion coefficient (XY direction; ppm/°C) | 9 | 10 | 11 | 12 | 12 | 14 | 15 | 16 |
| Thermal expansion coefficient (Z direction; ppm/°C) | 12 | 14 | 16 | 18 | 20 | 30 | 35 | 50 |

Fig. 6

| Resin composition | Double-sided copper-clad lamination | | | | | | | |
|---|---|---|---|---|---|---|---|---|
| | Example 2-1 | Example 2-2 | Example 2-3 | Example 2-4 | Example 2-5 | Comp. Example 2-1 | Comp. Example 2-2 | Comp. Example 2-3 |
| Example 1-1 | 0/10 | 0/10 | 0/10 | 0/10 | 0/10 | 0/10 | 0/10 | 0/10 |
| Example 1-2 | 0/10 | 0/10 | 0/10 | 0/10 | 0/10 | 0/10 | 0/10 | 0/10 |
| Comp. Example 1-1 | 3/10 | 3/10 | 4/10 | 5/10 | 5/10 | 8/10 | 10/10 | 10/10 |
| Comp. Example 1-2 | 1/10 | 2/10 | 2/10 | 2/10 | 3/10 | 5/10 | 7/10 | 7/10 |

Fig. 7

| Resin composition | Double-sided copper-clad lamination | | | | | | | |
|---|---|---|---|---|---|---|---|---|
| | Example 2-1 | Example 2-2 | Example 2-3 | Example 2-4 | Example 2-5 | Comp. Example 2-1 | Comp. Example 2-2 | Comp. Example 2-3 |
| Example 1-1 | 16 | 15 | 14 | 13 | 13 | 11 | 10 | 9 |
| Example 1-2 | 17 | 16 | 15 | 14 | 14 | 12 | 11 | 10 |
| Comp. Example 1-1 | 17 | 16 | 15 | 14 | 14 | 12 | 11 | 10 |
| Comp. Example 1-2 | 36 | 35 | 34 | 33 | 33 | 31 | 30 | 29 |

Fig. 8

| Resin composition | Double-sided copper-clad lamination | | | | | | | | |
|---|---|---|---|---|---|---|---|---|---|
| | Example 2-1 | Example 2-2 | Example 2-3 | Example 2-4 | Example 2-5 | Comp. Example 2-1 | Comp. Example 2-2 | Comp. Example 2-3 |
| Example 1-1 | 0/10 | 0/10 | 0/10 | 0/10 | 0/10 | 4/10 | 7/10 | 10/10 |
| Example 1-2 | 0/10 | 0/10 | 0/10 | 0/10 | 0/10 | 2/10 | 3/10 | 5/10 |
| Comp. Example 1-1 | 0/10 | 0/10 | 0/10 | 0/10 | 0/10 | 1/10 | 2/10 | 4/10 |
| Comp. Example 1-2 | 0/10 | 0/10 | 0/10 | 0/10 | 0/10 | 3/10 | 4/10 | 6/10 |

Fig. 9

| Resin composition | Comp. Example 1-1 | Comp. Example 1-2 | Example 1-1 | Example 1-2 |
|---|---|---|---|---|
| Double-sided copper-clad lamination Example 2-3 | 125.3 | 120.0 | 134.7 | 134.0 |
| Double-sided copper-clad lamination Comp. Example 2-2 | 153.0 | 134.7 | 167.3 | 154.0 |

SEMICONDUCTOR DEVICE

TECHNICAL FIELD

The present invention relates to a semiconductor device where a semiconductor chip is mounted on a substrate.

BACKGROUND ART

When a semiconductor chip is face-down mounted on a substrate, a gap is formed between the substrate and the chip, so that the gap must be filled with an insulating material called an underfill. A commonly used underfill has been conventionally a thermosetting resin represented by an epoxy resin (Patent Document 1).

Patent Document 1: Japanese Laid-open Patent Publication No. 11-233571

DISCLOSURE OF THE INVENTION

A semiconductor device in which a semiconductor chip is face-down mounted has the following problems.

A linear expansion coefficient is generally different between a substrate and a semiconductor chip. A substrate is made of a material containing an organic resin, which has a larger linear expansion coefficient than a semiconductor chip. Therefore, when a semiconductor device having a structure that a semiconductor chip is mounted on a substrate is subjected to heat history, a difference in a linear expansion coefficient between them causes warpage of the substrate. It is known that in a conventional semiconductor device, such warpage may cause cracks or damage in, for example, a semiconductor chip, an interface between a semiconductor chip and a bump, or an interface between a bump and a substrate.

In addition, warpage of a package in which a semiconductor chip is mounted on a substrate causes not only the damage described above but also difficulty in mounting a package on a substrate. It is, therefore, needed to minimize warpage of the package.

There have been recently utilized materials different from those conventionally used as a constituent material for a semiconductor chip or a material for a bump connecting a chip to a substrate, and thus it has been needed to design a new underfill suitable for these materials. For example, in a semiconductor chip, a low dielectric constant film called low-k has been used as an insulating film material constituting an interconnection layer. Such a film can be used to prevent crosstalk between interconnections and thus to provide a semiconductor device which can highly reliably operate at a high speed. Furthermore, lead-free materials are becoming dominant as a bump material in the light of environmental harmony.

The above damage such as cracks becomes more prominent when using a Low-k layer or a lead-free solder. A Low-k layer generally has insufficient mechanical strength. Even an insignificant stress in a chip due to, for example, warpage of a package may cause cracks in a Low-k layer. Furthermore, a lead-free solder has inadequate toughness, so that cracks tend to be generated in an interface between a bump and a chip or between a bump and a substrate.

For preventing both damages in a semiconductor chip and in a peripheral area of a bump, it is important to optimally design an underfill from a perspective different from the conventional technique while optimizing a substrate configuration. The present invention has been achieved from that point of view.

The present invention provides a semiconductor device, comprising
a substrate,
a semiconductor chip mounted on the substrate,
a bump connecting the substrate and the semiconductor chip, which is formed between the substrate and the semiconductor chip, and
an underfill filling the periphery of the bump, which is formed between the substrate and the semiconductor chip,
wherein
the bump is comprised of a lead-free solder,
the underfill is comprised of a resin material with an elastic modulus of 150 MPa to 3000 MPa both inclusive,
the underfill has a linear expansion coefficient of 40 ppm/° C. or less,
the substrate has a linear expansion coefficient of less than 14 ppm/° C. in an in-plane direction of the substrate, and
the substrate has a linear expansion coefficient of less than 30 ppm/° C. in a thickness direction of the substrate.

According to the present invention, an underfill is made of a resin material having a high elastic modulus, so that the periphery of a bump is so firmly fixed to prevent cracks in the periphery of the bump. In addition, since the substrate has a linear expansion coefficient of less than 14 ppm/° C. in an in-plane direction of the substrate and of less than 30 ppm/° C. in a thickness direction of the substrate, warpage in the substrate is prevented, so that damage in a semiconductor chip can be effectively prevented. Furthermore, reduction of warpage in the substrate can result in avoiding difficulty in mounting a semiconductor device on the substrate.

Herein, an elastic modulus of the underfill is as determined under an atmosphere of 125° C. Specifically, it is calculated from an initial slope in a stress-strain curve obtained by measurement using Tensilon testing machine at a rate of 1 mm/min under an atmosphere of 125° C.

BRIEF DESCRIPTION OF THE DRAWINGS

These and other objectives as well as features and advantages will be further appreciated with reference to the suitable embodiments described below and the accompanying drawings.

BEST MODE FOR CARRYING OUT THE INVENTION

The present invention relates to a semiconductor device where a semiconductor chip is mounted on a substrate. A substrate which can be used is a substrate mounted semiconductor chip such as a BGA substrate which is a supporting substrate mounted on a printed circuit board on which a semiconductor chip is mounted, or a printed circuit board.

Figure 1:
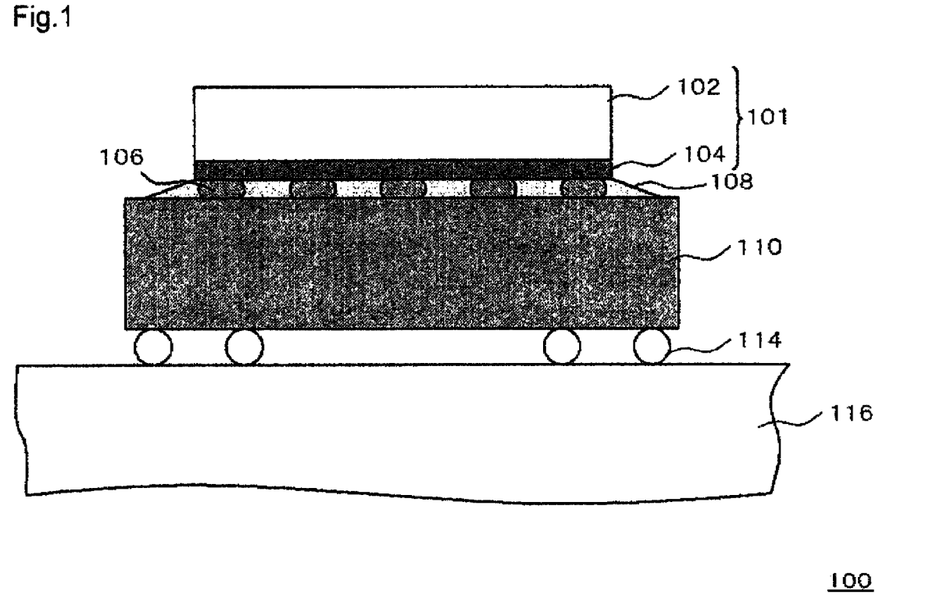
FIG. 1 shows a structure of a semiconductor device according to an embodiment.
Figure 2:
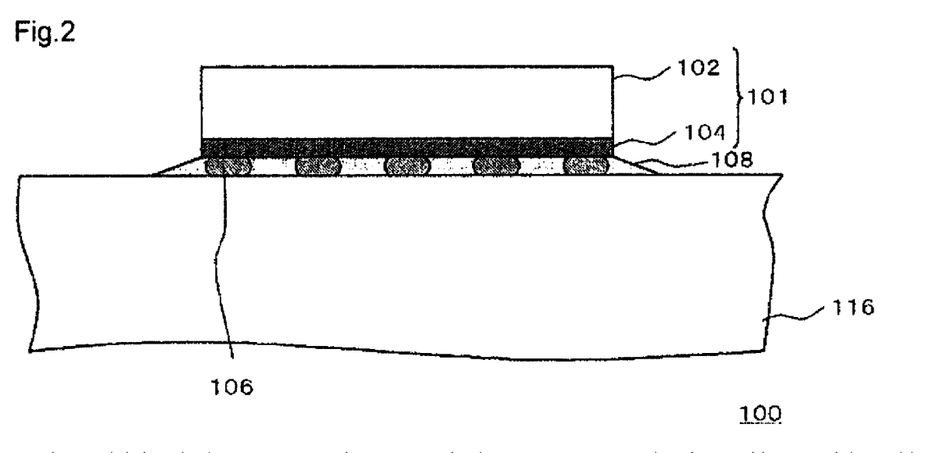
FIG. 2 shows a structure of a semiconductor device according to an embodiment.
Figure 3:
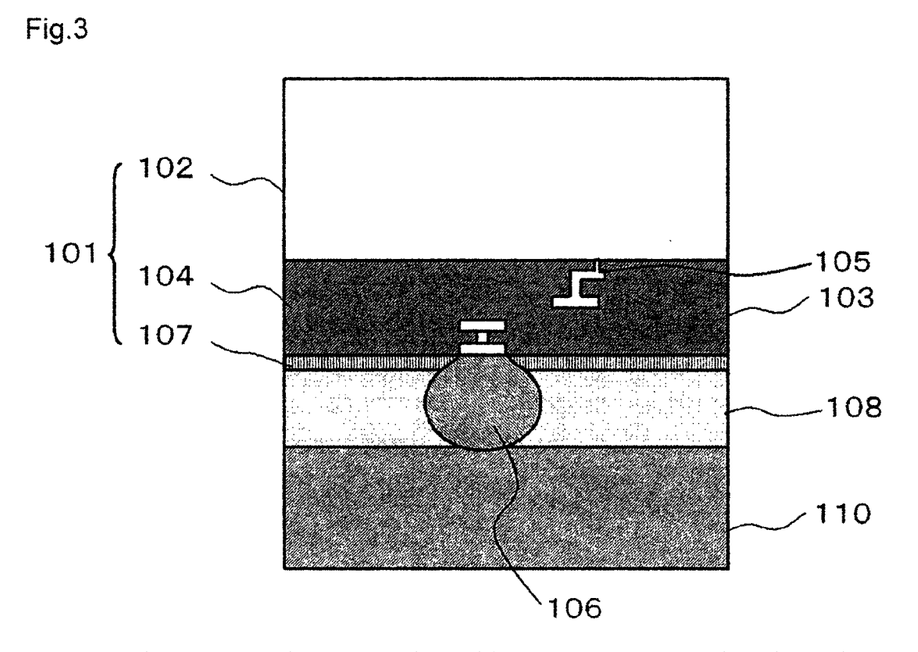
FIG. 3 shows a partial structure of a semiconductor device according to an embodiment.

FIG. 1 shows a schematic configuration of an example of a semiconductor device 100 according to the present invention. FIG. 2 shows a schematic configuration of another example. FIG. 3 is an enlarged view of FIG. 1. There will be described the example shown in FIG. 1.

The semiconductor device 100 has a BGA substrate 110, a semiconductor chip 101 mounted thereon, a bump 106 between them which connects the BGA substrate 110 to the semiconductor chip 101, and an underfill 108 filling the periphery of the bump 106.

The semiconductor chip 101 has a structure where on the main surface of a silicon substrate 102 are sequentially deposited an interlayer dielectric 104 including a copper interconnection 105, and a protective film 107. In an opening of the protective film 107 is formed a bump 106, through which the semiconductor chip 101 is connected to the BGA substrate 110. The interlayer dielectric 104 is a multilayer film, which includes a low dielectric constant film with a specific dielectric constant of 3.3 or less. The bump 106 is made of a lead-free solder. The underfill 108 is made of a resin material having an elastic modulus of 150 MPa to 3000 MPa both inclusive, preferably 150 MPa to 800 MPa both inclusive. A linear expansion coefficient of the BGA substrate 110 in an in-plane direction of the substrate is less than 14 ppm/° C., and a difference between a linear expansion coefficient of the underfill 108 and a linear expansion coefficient of the BGA substrate 110 in an in-plane direction of the substrate is 20 ppm/° C. or less.

Furthermore, a linear expansion coefficient of the underfill 108 is 40 ppm/° C. or less, and a linear expansion coefficient of the BGA substrate 110 in a thickness direction of the substrate is less than 30 ppm/° C.

As shown in FIG. 1, the semiconductor device 100 is mounted via a solder ball 114 on a printed circuit board 116.

There will be described the effects of this semiconductor device 100.

Damages to the interconnection layer 104 containing a Low-k layer are caused by a thermal stress due to a difference in a linear expansion coefficient between the semiconductor chip 101 and the BGA substrate 110. The damages can be effectively prevented by reducing a thermal stress generating between the semiconductor chip 101 and the BGA substrate 110. In this light, it is preferable that the underfill 108 has a low elastic modulus.

Cracks in an interface between the bump 106 and the semiconductor chip 101 are formed by deforming of the bump 106 caused by a thermal strain due to a difference in a linear expansion coefficient between the semiconductor chip 101 and the BGA substrate 110, leading to a large stress to the interface between the bump 106 and the semiconductor chip 101. For preventing the cracks, it is effective to prevent the bump 106 from being deformed. In this light, it is preferable that the underfill 108 has a high elastic modulus.

Attempting to solve these problems only by designing the underfill 108 would require contradictory properties to the underfill 108. Thus, this embodiment uses the underfill 108 with a high elastic modulus as described above while reducing a linear expansion coefficient of the BGA substrate 110 in an in-plane direction of the substrate, to prevent the interconnection layer 104 from being damaged.

Although the underfill 108 and the BGA substrate 110 having such properties can be prepared by various methods, an elastic modulus is herein improved by, for example, densely filling the underfill 108 with silica while reducing a linear expansion coefficient by, for example, using a cyanate resin as the BGA substrate 110.

The semiconductor device 100 according to this embodiment can effectively prevent (i) damages in an interconnection layer 104 containing a Low-k layer and (ii) crack generation in the interface between the bump 106 and the semiconductor chip 101, when being exposed to thermal history. The semiconductor device 100 according to this embodiment employs, as the underfill 108, a resin material having a higher elastic modulus range of 150 MPa to 3000 MPa both inclusive, preferably 150 MPa to 800 MPa both inclusive. Thus, the periphery of the bump 106 is firmly fixed to prevent deformation and thus to prevent cracks from generating in the interface between the bump 106 and the semiconductor chip 101. Furthermore, damages in the interconnection layer 104 containing a Low-k layer can be prevented by controlling a linear expansion coefficient of the BGA substrate 110 to less than 14 ppm/° C. in an in-plane direction of the substrate. Particularly, in this embodiment, damages in the interconnection layer 104 are reliably prevented by controlling a difference between a linear expansion coefficient of the semiconductor chip 101 and a linear expansion coefficient of the BGA substrate 110 in an in-plane direction of the substrate to 20 ppm or less.

In this embodiment, a linear expansion coefficient of the underfill 108 is adjusted to be larger than a linear expansion coefficient of the BGA substrate 110 in an in-plane direction of the substrate and smaller than a linear expansion coefficient of the bump 106. Furthermore, a difference in a linear expansion coefficient between the underfill 108 and the bump 106 is controlled to be 10 ppm or less, to further improve reliability to the semiconductor device 100. As described for the related art, combination of a lead-free solder and a semiconductor chip including a Low-k layer tends to lead to damages in the Low-k layer. Although the reasons are not clear, one of the reasons would be the fact that a lead-free solder has a higher elastic modulus than a lead-containing solder, that is, it is harder and fragile. Thus, the present invention suitably designs a material for the underfill 108 to reduce a difference in a linear expansion coefficient between the bump 106 and the underfill 108 surrounding the bump, to reduce a thermal stress/thermal strain generated in the interface between them, and to prevent damages in the Low-k layer.

There will be described a configuration of each component in the semiconductor device 100 in detail.

Substrate

The BGA substrate 110 is a substrate supporting the semiconductor chip 101. A linear expansion coefficient of the BGA substrate 110 in an in-plane direction of the substrate is preferably less than 14 ppm/° C., more preferably 12 ppm/° C. or less. A linear expansion coefficient of the BGA substrate 110 in a thickness direction of the substrate is preferably less than 30 ppm/° C. Furthermore, a linear expansion coefficient of the BGA substrate 110 in a thickness direction of the substrate is more preferably 20 ppm/° C. or less. A linear expansion coefficient of the BGA substrate 110 within the above range allows damages in a Low-k layer to be prevented while preventing damages in the periphery of the bump.

The BGA substrate 110 preferably has a high glass-transition temperature. Specifically, it is preferably 220° C. or higher, more preferably 230° C. or higher. Thus, there is provided a semiconductor device exhibiting excellent heat resistance and reliability.

The BGA substrate 110 is prepared by impregnating a base material such as a glass cloth with a thermosetting resin.

Examples of the base material include glass-fiber base materials such as glass woven fabrics, glass unwoven fabrics and glass papers; woven and unwoven fabrics made of organic fibers such as paper (pulp), aramids, polyesters and fluororesins; and woven fabrics, unwoven fabrics and mats made of materials such as metal fibers, carbon fibers and mineral fibers. These base materials can be used alone or in combination.

Examples of a thermosetting resin impregnated in the base material include epoxy resins, BT resins and cyanate resins, which can be used alone or in combination of two or more. In this embodiment, novolac type cyanate resin is used. A novolac type cyanate resin is, for example, that represented by formula (I), in which n represents a positive number.

Thus, a linear expansion coefficient of the substrate can be effectively reduced and warpage in the substrate can be prevented. A plurality of the novolac type cyanate resins with larger and smaller molecular weights can used in combination.

In addition to the above cyanate resins, the thermosetting resin impregnated in the base material may be an epoxy resin or novolac resin having a biphenylalkylene skeleton. Thus, flame resistance and moisture resistance can be improved while maintaining the properties of a low linear expansion coefficient and a high elastic modulus.

The resin comprising the BGA substrate 110 can contain a curing catalyst. Examples of the curing catalyst include organic metal salts such as zinc naphthenate, cobalt naphthenate, tin octylate and cobalt octylate; tertiary amines such as triethylamine, tributylamine and diazabicyclo[2,2,2]octane; imidazoles such as
2-phenyl-4-methylimidazole, 2-ethyl-4-methylimidazole,
2-phenyl-4,5-dihydroxymethylimidazole and
2-phenyl-4-methyl-5-hydroxymethylimidazole; phenol compounds such as phenol, bisphenol A and nonylphenol; phenol resins and organic acids. These can be used alone or in combination. Among these, phenol resins (particularly, phenol novolac resins) can be used.

A resin composition comprising the BGA substrate 110 contains a filler. Examples of a filler include silicates such as talc, clay, mica and glasses; oxides such as alumina and silica; carbonates such as calcium carbonate and magnesium carbonate; and hydroxides such as aluminum hydroxide and magnesium hydroxide. Among these, silica is preferable. Thus, a linear expansion coefficient of the BGA substrate 110 can be reduced while increasing its elastic modulus. A content of silica is preferably 60% by mass or more, more preferably 65% by mass or more on the basis of the total amount of the resin composition for the BGA substrate 110. Thus, a linear expansion coefficient can be further reduced while an elastic modulus can be further increased.

There are no particular restrictions to a filler, but it is preferably powdery; particularly, a powdery inorganic filler can be used. Thus, flowability of the resin composition can be further controlled. Furthermore, a prepreg can be changed more low-expansion.

The silica is preferably fused silica. Its shape is preferably spherical. As a silica content is increased, resin flowability is reduced, leading to deterioration in manufacturing stability of the substrate. Thus, it is important to increase a silica content within the range where resin flowability is satisfactorily maintained, and the above shape allows a silica content to increase, resulting in reduction in a linear expansion coefficient of the BGA substrate 110.

An average particle size of the above filler is preferably 2 µm or less, particularly preferably 0.2 to 1 µm. An average particle size of the filler within the range allows a filling rate to be increased.

The silica may be surface-treated with a silane coupling agent. Examples of the silane coupling agent include various silanes such as epoxysilanes, aminosilanes and vinyl silanes. Such a surface-treated silica can be used to further improve a silica content.

Semiconductor Chip

A semiconductor chip 101 has, as an interlayer dielectric, a so-called Low-k layer. A Low-k layer means a film with a specific dielectric constant of 3.3 or less. Examples of a Low-k layer include organic films such as SiOC, MSQ (methylsilsesquioxane) and benzocyclobutene; and inorganic films such as HSQ (hydroxysilsesquioxane), and these films which have been made porous can be suitably used.

The semiconductor chip 101 has an interconnection layer of the above-mentioned Low-k layer on a silicon substrate. It may have various functions such as, but not limited to, logic devices, memory devices and combination thereof.

Bump

The bump 106 is made of a lead-free solder. This embodiment employs a tin-silver solder. A component for the bump 106 is not limited to it and may be, for example, a tin-bismuth or tin-zinc series. The bump 106 may have, for example, a linear expansion coefficient of 10 ppm/° C. to 25 ppm/° C. both inclusive.

Underfill

A component material for the underfill 108 may be a liquid thermosetting resin or film thermosetting resin. Among these, a liquid thermosetting resin is preferable because it can efficiently fill a gap between the substrate and the chip. In this embodiment, the underfill 108 is made of a high elastic-modulus material. Specifically, it has an elastic modulus of 150 MPa or more, further preferably 200 MPa or more. There are no particular restrictions to the upper limit of an elastic modulus, but it is, for example, 3000 MPa or less, preferably 800 MPa or less. A resin material having an elastic modulus within the above range can be used to more effectively prevent cracks around the bump 106.

Here, an elastic modulus of the underfill 108 is determined under an atmosphere of 125° C. Specifically, it is calculated from an initial slope in a stress-strain curve obtained by measurement using Tensilon testing machine at a rate of 1 mm/min under an atmosphere of 125° C.

The underfill 108 is placed in a gap between the BGA substrate 110 and the semiconductor chip 101. The underfill 108 can be formed by various methods such as curing a liquid adhesive injected into a gap, curing a sheet adhesive placed in a gap.

A resin material used for the underfill 108 may be selected from various materials. For example, epoxy resins, BT resins and cyanate resins can be used. As a cyanate resin, the novolac type cyanate resin as described for the substrate material can be suitably used.

A resin material comprising the underfill 108 preferably contain a multifunctional epoxy resin. It allows a cured resin to have an improved crosslink density and a higher elastic modulus.

The underfill 108 may contain an inorganic filler such as silica particles. It allows for effective reduction of a linear expansion coefficient and further effective reduction of damages in the semiconductor chip 101 or between the semiconductor chip 101 and the BGA substrate 110.

The underfill 108 may contain a coupling agent. It allows for improvement in adhesiveness of the bump 106 or the inorganic filler to the underfill 108, and reduction of a linear expansion coefficient and more effective reduction of damages in the semiconductor chip 101 or between the semiconductor chip 101 and the BGA substrate 110. Examples of a coupling agent which can be used include silane coupling agents such as epoxysilanes and aminosilanes; and titanate coupling agents. These can be used in combination. The coupling agent may be used in a style that it is dispersed in a binder site in the underfill 108 or that it adheres to the surface of an inorganic filler such as silica particles. Alternatively, these styles may be combined. For example, when silica particles are added, the silica surface can be pre-treated with a coupling agent.

A linear expansion coefficient of the underfill 108 is preferably 40 ppm/° C. or less, more preferably 30 ppm/° C. or less. A linear expansion coefficient of the BGA substrate 110 within the above range allows damages to be more effectively prevented in the Low-k layer and in the periphery of the bump.

Although the BGA substrate 110 is used as a substrate for a semiconductor device in this embodiment, the substrate may be a printed circuit board 116 as shown in FIG. 2.

EXAMPLE 1

The present invention will be detailed with reference to Examples and Comparative Examples, but the present invention is not limited to them.

First, an underfill material used in this example will be described.

EXAMPLE 1-1

Preparation of a resin composition: 13.5 parts by weight of bisphenol-F type epoxy resin (epoxy equivalent: 165), 13.5 parts by weight of N-[2-methyl-4-(oxiranylmethoxy)phenyl]-N-(oxiranylmethyl)oxiraneme thanamine (Sumitomo Chemical Co., Ltd., ELM-100), 13 parts by weight of 4,4'-methylenebis-(2-ethylaniline) (Nippon Kayaku Co., Ltd., KAYAHARD AA), 1 part by weight of γ-glycidylpropyltriethoxysilane and 65 parts by weight of spherical fused silica SO-25R (Admatechs Co., Ltd.) were weighed and kneaded by a three-roll mill, to prepare a liquid resin composition after degassing in vacuo.

EXAMPLE 1-2

A procedure was conducted as described in Example 1-1, except that the following resin composition was used. That is, were used 18 parts by weight of bisphenol-F type epoxy resin (epoxy equivalent: 165), 6 parts by weight of N-[2-methyl-4-(oxiranylmethoxy)phenyl]-N-(oxiranylmethyl)oxiraneme thanamine (Sumitomo Chemical Co., Ltd., ELM-100) and 10 parts by weight of 4,4'-methylenebis-(2-ethylaniline) (Nippon Kayaku Co., Ltd., KAYA-HARD AA).

COMPARATIVE EXAMPLE 1-1

A procedure was conducted as described in Example 1-1, except that the following resin composition was used. That is, were used 30 parts by weight of bisphenol-F type epoxy resin (epoxy equivalent: 165) and 10 parts by weight of 4,4'-methylenebis-(2-ethylaniline) (Nippon Kayaku Co., Ltd., KAYAHARD AA) without N-[2-methyl-4-(oxiranylmethoxy)phenyl]-N-(oxiranylmethyl)oxiraneme thanamine (Sumitomo Chemical Co., Ltd., ELM-100).

COMPARATIVE EXAMPLE 1-2

A procedure was conducted as described in Example 1-1, except that the following resin composition was used. That is, were used 20 parts by weight of bisphenol-F type epoxy resin (epoxy equivalent: 165), 20 parts by weight of N-[2-methyl-4-(oxiranylmethoxy)phenyl]-N-(oxiranylmethyl)oxiraneme thanamine (Sumitomo Chemical Co., Ltd., ELM-100), 19 parts by weight of 4,4'-methylenebis-(2-ethylaniline) (Nippon Kayaku Co., Ltd., KAYAHARD AA), 1 part by weight of γ-glycidylpropyltriethoxysilane and 40 parts by weight of spherical fused silica SO-25R (Admatechs Co., Ltd.).

The resin compositions prepared by the above examples and comparative examples were evaluated as follows. Evaluated properties are shown together with the evaluation methods. The results are shown in FIG. 4.

Elastic modulus: a paste was formed into a test sample with a size of 10 mm (width)×about 150 mm (length)×4 mm (thickness), which was then cured in a 200° C. oven for 30 min, and then its elastic modulus was calculated from an initial slope in a stress-strain curve obtained by measurement using Tensilon testing machine at a rate of 1 mm/min under an atmosphere of 125° C.

Glass-transition temperature and thermal expansion coefficient: a capillary underfill material was cured at 150° C. for 120 min and cut into a 5×5×10 mm test piece. The sample was used to determine this property using Seiko TMA/SS120 under the conditions of a compressive load of 5 g and a temperature increase rate of 10° C./min within a temperature range of −100° C. to 300° C. This measuring method also provided a thermal expansion coefficient (linear expansion coefficient).

Figure 4:
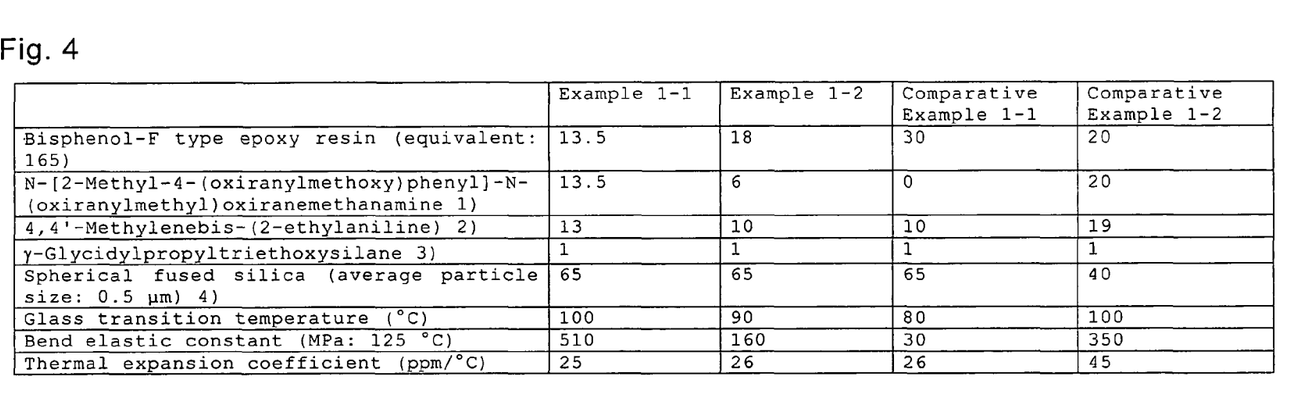
FIG. 4 shows the composition of the underfill materials used in Examples.

Resins and so forth in FIG. 4 will be specifically described.

ELM100 (N-[2-methyl-4-(oxiranylmethoxy)phenyl]-N-(oxiranylmethyl)oxiranem ethanamine): Sumitomo Chemical Co., Ltd., KAYAHARD AA (4,4'-methylenebis-(2-ethylaniline)): Nippon Kayaku Co., Ltd., KBE403 (γ-glycidylpropyltriethoxysilane): Shin-Etsu Chemical Co., Ltd.

SO-25R (spherical fused silica, average particle size: 0.5 μm): Admatechs Co., Ltd.

A double-sided copper-clad laminate was prepared as follows.

EXAMPLE 2-1

Preparation of a resin varnish: 20 parts by weight of a novolac type cyanate resin (Lonza Japan Ltd., Primaset PT-60), 6 parts by weight of a biphenyldimethylene type epoxy resin (Nippon Kayaku Co., Ltd., NC-3000P), 4 parts by weight of a biphenyldimethylene type phenol resin (Meiwa Plastic Industries Ltd., MEH-7851-S) and 0.3 parts by weight of an epoxysilane type coupling agent (Nippon Unicar Company Ltd., A-187) were dissolved in methylethyl ketone at room temperature, and to the mixture were added 60 parts by weight of spherical fused silica SO-25R (Admatechs Co., Ltd.) and 10 parts by weight of SFP-10X (average particle size: 0.3 μm; Denki Kagaku Kogyo Kabushiki Kaisha), and then the mixture was stirred for 10 min using a high-speed stirrer to prepare a resin varnish.

Preparation of a prepreg: the above-mentioned resin varnish was impregnated in a glass woven fabric (thickness: 200 μm, Nitto Boseki Co., Ltd., WEA-7628), which was dried in a furnace at 120° C. for 2 min, to prepare a prepreg having varnish solid content (a proportion of the resin and silica in the prepreg) of about 50%.

Preparation of a lamination: A given number of the above prepregs were piled and 18 μm copper foils were attached to both sides, and the product was molded under heating and pressing at a pressure of 4 MPa and a temperature of 200° C. for 2 hours, to prepare a double-sided copper-clad laminate.

EXAMPLE 2-2

A procedure was conducted as described in Example 2-1, except that a resin varnish had the following composition. That is, were used 11 parts by weight of a biphenyldimethylene type epoxy resin (Nippon Kayaku Co., Ltd., NC-3000P), 9 parts by weight of a biphenyldimethylene type phenol resin (Meiwa Plastic Industries Ltd., MEH-7851-S) and 60 parts by weight of SO-25R (Admatechs Co., Ltd.) as a spherical fused silica.

EXAMPLE 2-3

A procedure was conducted as described in Example 2-1, except that a resin varnish had the following composition. A novolac type cyanate resin was 30 parts by weight of Primaset PT-60 (Lonza Japan Ltd.) and 10 parts by weight of Primaset PT-30 (weight average molecular weight: about 700). An epoxy resin was 8 parts by weight of a biphenyldimethylene type epoxy resin. A phenol resin was 5 parts by weight of a biphenyldimethylene type phenol novolac resin and 2 parts by weight of a phenol novolac resin (PR-51714, hydroxyl equivalent: 103, Sumitomo Bakelite Co., Ltd.). An inorganic filler was 40 parts by weight of a spherical fused silica SO-25R (average particle size: 1.5 μm) and 5 parts by weight of SFP-10X (average particle size: 0.3 μm; Denki Kagaku Kogyo Kabushiki Kaisha).

EXAMPLE 2-4

A procedure was conducted as described in Example 2-1, except that a resin varnish had the following composition. That is, were used 11 parts by weight of a biphenyldimethylene type epoxy resin (Nippon Kayaku Co., Ltd., NC-3000P), 9 parts by weight of a biphenyldimethylene type phenol novolac resin (Meiwa Plastic Industries Ltd., MEH-7851-S) and 50 parts by weight of SO-25R (Admatechs Co., Ltd.) as a spherical fused silica.

EXAMPLE 2-5

A procedure was conducted as described in Example 2-1, except that a resin varnish had the following composition. That is, were used 8 parts by weight of a biphenyldimethylene type epoxy resin (Nippon Kayaku Co., Ltd., NC-3000P), 7 parts by weight of a biphenyldimethylene type phenol resin (Meiwa Plastic Industries Ltd., MEH-7851-S) and 45 parts by weight of SO-25R (Admatechs Co., Ltd.) as a spherical fused silica.

COMPARATIVE EXAMPLE 2-1

A procedure was conducted as described in Example 2-1, except that a resin varnish had the following composition without a cyanate resin. That is, the procedure in Example 2-1 was conducted, except using a composition of 22.5 parts by weight of a biphenylalkylene type epoxy resin NC-3000P (epoxy equivalent: 275; Nippon Kayaku Co., Ltd.), 17.5 parts by weight of a biphenyldimethylene type phenol resin and 60 parts by weight of SO-25R (Admatechs Co., Ltd.) as a spherical fused silica.

COMPARATIVE EXAMPLE 2-2

A procedure was conducted as described in Example 2-1, except that a resin varnish had the following composition. That is, were used 20 parts by weight of a biphenyldimethylene type epoxy resin (Nippon Kayaku Co., Ltd., NC-3000P), 15 parts by weight of a biphenyldimethylene type phenol resin (Meiwa Plastic Industries Ltd., MEH-7851-S) and 25 parts by weight of SO-25R (Admatechs Co., Ltd.) as a spherical fused silica.

COMPARATIVE EXAMPLE 2-3

Figure 5:
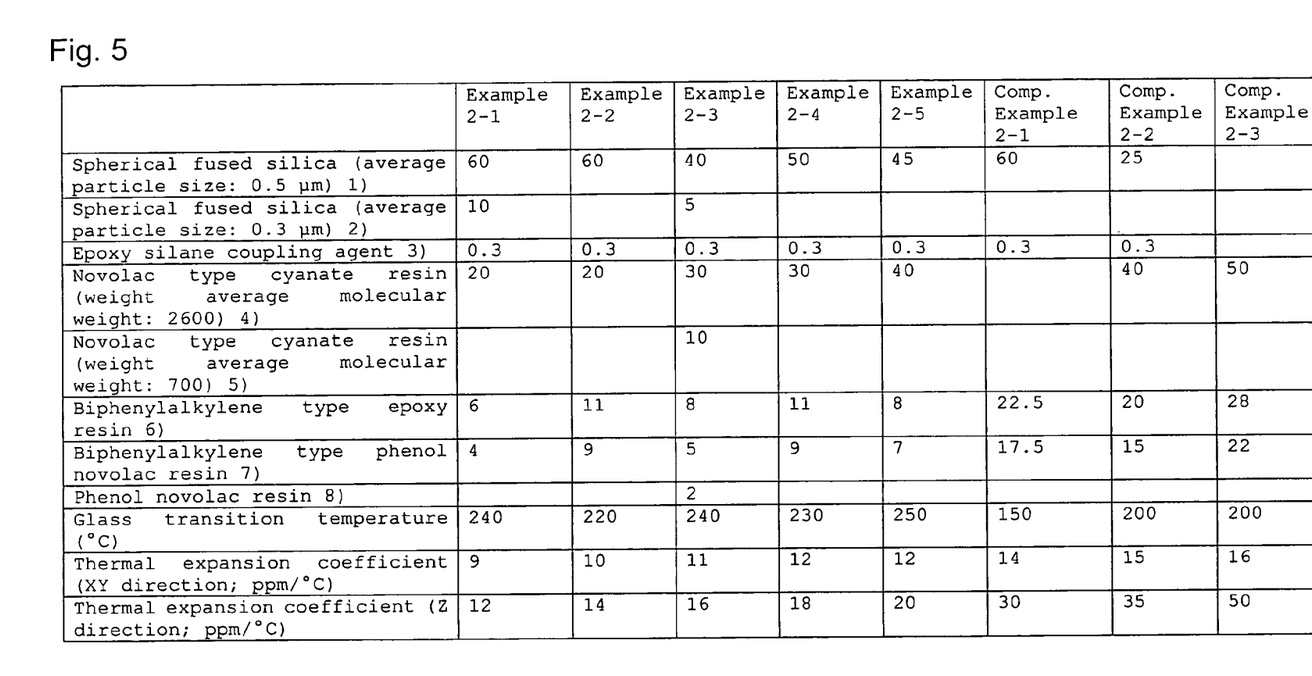
FIG. 5 shows the components of the substrates used in Examples.

A procedure was conducted as described in Example 2-1, except that a resin varnish was as described in FIG. 5 without a spherical fused silica. That is, the procedure in Example 2-1 was conducted, except using a composition of 50 parts by weight of a novolac type cyanate resin, 28 parts by weight of a biphenyldimethylene type epoxy resin and 22 parts by weight of a biphenyldimethylene type phenol resin.

The laminations prepared by the above examples and comparative examples were evaluated as follows. Evaluated properties are shown together with the evaluation methods. The results are shown in FIG. 5.

(i) Linear Expansion Coefficient (in the Figure, Referred to as a "Thermal Expansion Coefficient")

Linear expansion coefficients in an in-plane and a thickness directions (XY direction and Z direction, respectively) were determined at 5° C./min using TMA for a 2 mm×2 mm test piece cut from a lamination prepared by overall etching of a double-sided copper-clad laminate with a thickness of 1.2 mm.

(ii) Glass-Transition Temperature

A double-sided copper-clad laminate with a thickness of 0.6 mm was overall etched to give a lamination, from which a 10 mm×60 mm test piece was cut, and the test piece was heated at 3° C./min using a dynamic viscoelasticity measuring device DMA983 (TA Instruments Co., Ltd), to determine a peak position of tan δ, which was defined as a glass-transition temperature.

The resins and so forth in FIG. 5 will be detailed.

Primaset PT-60 (a novolac type cyanate resin, weight average molecular weight: about 2600): Lonza Japan Ltd., Primaset PT-30 (a novolac type cyanate resin, weight average molecular weight: about 700): Lonza Japan Ltd., MEH-7851-S (a biphenylalkylene type novolac resin, hydroxyl equivalent: 203): Meiwa Plastic Industries Ltd., PR-51714 (a novolac resin, hydroxyl equivalent: 103, weight average molecular weight: about 1600): Sumitomo Bakelite Co., Ltd., SO-25R (a spherical fused silica, average particle size: 0.5 μm): Admatechs Co., Ltd., SFP-10X (a spherical fused silica, average particle size: 0.3 μm): Denki Kagaku Kogyo Kabushiki Kaisha, A-187 (an epoxysilane type coupling agent): Nippon Unicar Co., Ltd.

The present invention will be detailed with reference to, but not limited to, Examples and Comparative Examples.

Using the double-sided copper-clad laminates prepared in Examples 2-1 to 2-5 and Comparative Examples 2-1 to 2-3, were prepared printed circuit boards for evaluation, in which a bump electrode had been preliminarily formed. The printed circuit board thus prepared was temporarily attached to a semiconductor chip having an interlayer dielectric made of a low-dielectric constant material (an SiOC film formed by CVD, specific dielectric constant=2.2) while positioning a lead-free solder (composition: Sn-3.5Ag, melting point: 221° C., coefficient of thermal expansion: 22 ppm/° C., elastic modulus: 44 GPa) using a flip chip bonder, and was then passed through a reflow furnace (reflow conditions: the highest temperature of 260° C., the lowest temperature of 183° C. and IR reflow of 60 sec) to be firmly attached to the solder bump.

Since a linear expansion coefficient of the semiconductor chip is 3 ppm/° C., values of (a linear expansion coefficient in X-Y direction of the printed circuit board for evaluation)-(a linear expansion coefficient of the semiconductor chip) are 6, 7, 8, 9, 9, 11, 12 and 13 ppm/° C. for Examples 2-1, 2-2, 2-3, 2-4 and 2-5, and Comparative Examples 2-1, 2-2 and 2-3, respectively.

Furthermore, values of (a linear expansion coefficient in Z direction of the printed circuit board for evaluation)-(a linear expansion coefficient of the semiconductor chip) are 9, 11, 13, 15, 17, 27, 32 and 47 ppm/° C. for Examples 2-1, 2-2, 2-3, 2-4 and 2-5, and Comparative Examples 2-1, 2-2 and 2-3, respectively.

Since the solder bump has a linear expansion coefficient of 22 ppm/° C., values of (a linear expansion coefficient of the underfill)-(a linear expansion coefficient of the solder bump) are 3, 4, 4 and 23 ppm/° C. for Examples 1-1 and 1-2, and Comparative Examples 1-1 and 1-2, respectively. A difference of a linear expansion coefficient is small between Examples 1-1 and 1-2.

Then, the resin composition prepared in Example 1-1, 1-2, 2-1 or 2-2 was injected to prepare a flip chip package for evaluation. The flip-chip mounted semiconductor chip is a logic device having a structure where a multilayer copper interconnection is formed on a silicon substrate. The interlayer dielectric containing the multilayer copper interconnection includes the porous SiOC film (dielectric constant: 2.5 or less) formed by plasma CVD.

Figure 6:
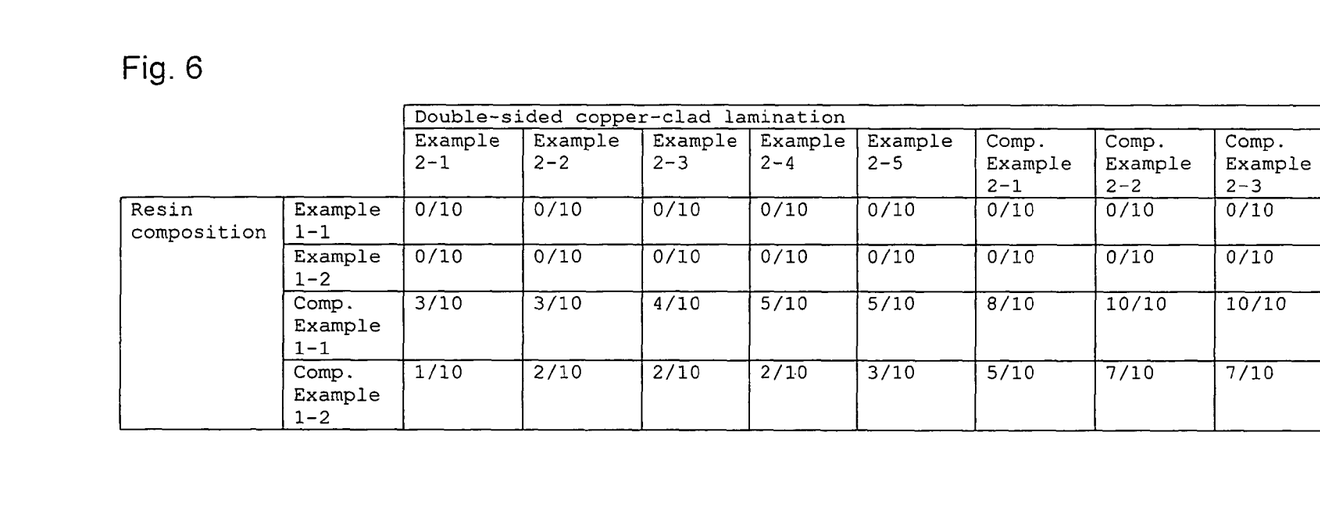
FIG. 6 shows the evaluation results of Examples.

The flip chip packages for evaluation thus prepared were subjected to a thermal cycle test to compare/evaluate protective performance of the lead-free solder bump and of the interlayer dielectric made of a low-dielectric constant material. These packages for evaluation were processed by a thermal cycle (1000 cycles of cooling at −55° C. and heating at 125° C.) and then subjected to a conduction test where those with all bumps being conductive were counted as accepted packages. FIG. 6 shows the list of the test samples and the conduction test results. The conduction test results are expressed using, as a measure, a ratio of the number of passed samples without defective conduction to 10 samples.

Figure 7:
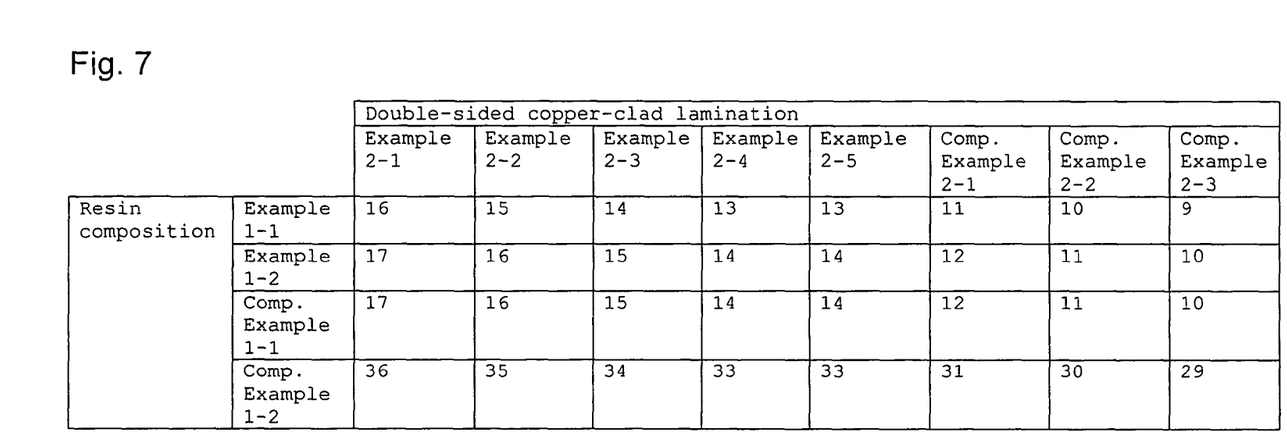
FIG. 7 illustrates the components of the semiconductor devices used in Examples.

FIG. 7 shows a value of (a linear expansion coefficient of the underfill 108)-(a linear expansion coefficient in an in-plane direction of the substrate of the printed circuit board) for each test sample.

Figure 8:
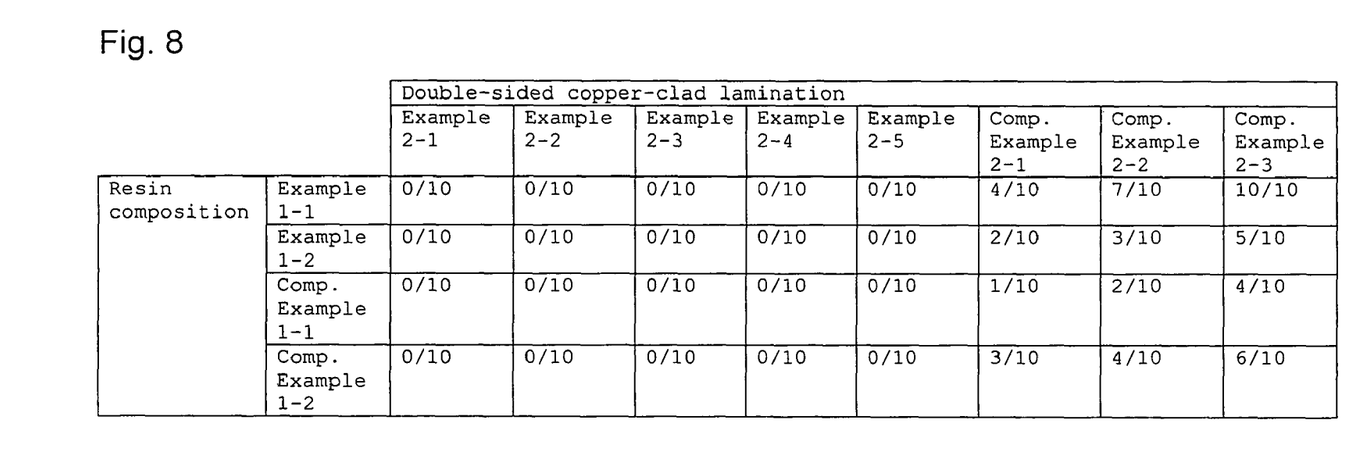
FIG. 8 shows the evaluation results of Examples.

FIG. 8 shows a list of the test samples and the results of crack generation in an interlayer dielectric. A package after thermal cycle treatment was cut and observed for crack generation in an interlayer insulating layer within the semiconductor chip.

Figure 9:
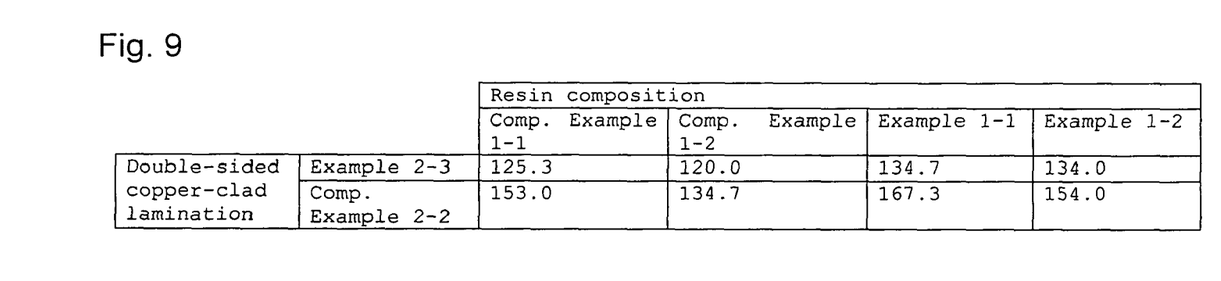
FIG. 9 shows the evaluation results of Examples.

A package for evaluation was used to determine a package warpage after each manufacturing step and thermal cycles. FIG. 9 shows a list of the test samples and the warpage results.

A warpage was determined by three-dimensional shape measurement (Keyence Corporation, EMS2002AD-3D). The unit in FIG. 9 is μm.

As shown in FIG. 6, defective conduction was not observed in a flip chip package prepared using the resin composition of Example 1-1 or 1-2 in combination with all the printed circuit boards for evaluation. In contrast, defective conduction was observed in the flip chip package prepared by the resin composition of Comparative Example 1-1 or 1-2 in combination with any of the printed circuit boards for evaluation. When the solder bump connection at the site of defective conduction was cut and the cross section was evaluated, cracks were observed in the solder bump connection in every defective conduction site. The results indicate that a high elastic modulus under heating and a small difference in a coefficient of thermal expansion between the lead-free solder and the resin composition are important for preventing cracks in the lead-free solder junction in a thermal cycle test. It indicates the importance of increasing an elastic modulus under heating to prevent deformation of the lead-free solder bump caused by a strain generated due to a difference in a coefficient of thermal expansion between the semiconductor chip and the printed circuit board and of making a coefficient of thermal expansion of the resin composition close to a coefficient of thermal expansion of the lead-free solder bump.

As shown in FIG. 8, in a flip chip package prepared using the printed circuit board of Example 2-1, 2-2, 2-3, 2-4 or 2-5, cracks were not generated in an interlayer dielectric after a thermal cycle process in combination with all resin composition for evaluation. In contrast, in a flip chip package prepared using the printed circuit boards of Comparative Example 2-1, 2-2 or 2-3, cracks were generated in an interlayer dielectric in combination with all the resin compositions. The results indicate the importance of using a double-sided copper-clad laminate with small thermal expansion coefficients in XY direction and Z direction and a high glass-transition temperature as a printed circuit board for preventing cracks in the interlayer dielectric. It indicates that a stress generated in a semiconductor chip by a difference in a coefficient of thermal expansion between the semiconductor chip and the printed circuit board is controlled by reducing thermal expansion coefficients in XY direction and Z direction and increasing a glass-transition temperature and thus to prevent cracks in an interlayer insulating layer made of a low-dielectric constant material.

As shown in FIG. 9, in a flip chip package prepared using the printed circuit board of Example 2-3, the effect of reduction in package warpage was observed in combination of all resin compositions for evaluation, compared to the printed circuit board of Comparative Example 2-2. The results indicate the importance of using a double-sided copper-clad laminate with small thermal expansion coefficients in XY direction and Z direction and a high glass-transition temperature as a printed circuit board for reducing package warpage.

The invention claimed is:

1. A semiconductor device, comprising a substrate, a semiconductor chip mounted on said substrate, a bump connecting said substrate and said semiconductor chip, which is formed between said substrate and said semiconductor chip, and an underfill filling the periphery of said bump, which is formed between said substrate and said semiconductor chip wherein said bump is comprised of a lead-free solder, said underfill is comprised of a resin material with an elastic modulus of 150 MPa to 3000 MPa both inclusive, said underfill has a linear expansion coefficient of 40 ppm/° C. or less, said substrate has a linear expansion coefficient of less than 14 ppm/° C. in an in-plane direction of the substrate, and said substrate has a linear expansion coefficient of less than 30 ppm/° C. in a thickness direction of the substrate.

2. The semiconductor device as claimed in claim 1, wherein said underfill is comprised of a resin material having an elastic modulus of 150 MPa to 800 MPa both inclusive.

3. The semiconductor device as claimed in claim 2, wherein said substrate has a glass-transition temperature of 220° C. or higher.

4. The semiconductor device as claimed in claim 2, wherein said semiconductor chip comprises a silicon substrate; an interlayer dielectric containing a low dielectric constant film having a specific dielectric constant of 3.3 or less on said silicon substrate; and an interconnection formed in said interlayer dielectric.

5. The semiconductor device as claimed in claim 4, wherein said low dielectric constant film comprises Si, O and C.

6. The semiconductor device as claimed in claim 4, wherein said low dielectric constant film is a porous film.

7. The semiconductor device as claimed in claim 2, wherein a linear expansion coefficient of said underfill is larger than a linear expansion coefficient of said substrate in an in-plane direction of the substrate and smaller than a linear expansion coefficient of said bump.

8. The semiconductor device as claimed in claim 7, wherein a difference between a linear expansion coefficient of said underfill and a linear expansion coefficient of said bump is 10 ppm/° C. or less.

9. The semiconductor device as claimed in claim 2, wherein said substrate comprises a cyanate resin.

10. The semiconductor device as claimed in claim 2, wherein a difference between a linear expansion coefficient of said substrate in an in-plane direction of the substrate and a linear expansion coefficient of said semiconductor chip is 20 ppm/° C. or less.

11. The semiconductor device as claimed in claim 2, wherein said lead-free solder comprises tin and silver.

* * * * *